United States Patent
Höppel et al.

(10) Patent No.: US 9,627,588 B2
(45) Date of Patent: Apr. 18, 2017

(54) METHOD FOR PRODUCING AN OPTOELECTRONIC SEMICONDUCTOR CHIP, AND OPTOELECTRONIC SEMICONDUCTOR CHIP

(71) Applicant: OSRAM Opto Semiconductors GmbH, Regensburg (DE)

(72) Inventors: Lutz Höppel, Alteglofsheim (DE); Norwin Von Malm, Nittendorf-Thumhausen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/018,845

(22) Filed: Feb. 8, 2016

(65) Prior Publication Data
US 2016/0225957 A1    Aug. 4, 2016

Related U.S. Application Data

(62) Division of application No. 13/704,600, filed as application No. PCT/EP2011/058653 on May 26, 2011, now Pat. No. 9,257,612.

(30) Foreign Application Priority Data

Jun. 17, 2010  (DE) .................. 10 2010 024 079

(51) Int. Cl.
*H01L 33/00* (2010.01)
*H01L 33/46* (2010.01)
(Continued)

(52) U.S. Cl.
CPC .......... *H01L 33/46* (2013.01); *H01L 27/0248* (2013.01); *H01L 29/861* (2013.01);
(Continued)

(58) Field of Classification Search
CPC . H01L 29/808; H01L 29/8086; H01L 29/812; H01L 29/8613; H01L 29/1066;
(Continued)

(56) References Cited

U.S. PATENT DOCUMENTS 7,265,392 B2   9/2007 Hahn et al.
8,008,683 B2   8/2011 Choi et al.
(Continued)

FOREIGN PATENT DOCUMENTS

CN     1588657 A    3/2005
CN   101960575 A    1/2011
(Continued)

*Primary Examiner* — Thanh Y Tran
(74) *Attorney, Agent, or Firm* — McDermott Will & Emery LLP

(57) ABSTRACT

A method for producing an optoelectronic semiconductor chip is specified, comprising the following steps: providing an n-conducting layer (2), arranging a p-conducting layer (4) on the n-conducting layer (2), arranging a metal layer sequence (5) on the p-conducting layer (4), arranging a mask (6) at that side of the metal layer sequence (5) which is remote from the p-conducting layer (4), in places removing the metal layer sequence (5) and uncovering the p-conducting layer (4) using the mask (6), and in places neutralizing or removing the uncovered regions (4a) of the p-conducting layer (4) as far as the n-conducting layer (2) using the mask (6), wherein the metal layer sequence (5) comprises at least one mirror layer (51) and a barrier layer (52), and the mirror layer (51) of the metal layer sequence (5) faces the p-conducting layer (4).

15 Claims, 11 Drawing Sheets

(51) Int. Cl.

| | | |
|---|---|---|
| *H01L 33/38* | (2010.01) | |
| *H01L 31/0232* | (2014.01) | |
| *H01L 27/02* | (2006.01) | |
| *H01L 29/861* | (2006.01) | |
| *H01L 33/44* | (2010.01) | |
| *H01L 33/62* | (2010.01) | |
| *H01L 31/0224* | (2006.01) | |
| *H01L 31/18* | (2006.01) | |
| *H01L 33/20* | (2010.01) | |

(52) U.S. Cl.
CPC ...... *H01L 31/02327* (2013.01); *H01L 33/382* (2013.01); *H01L 33/44* (2013.01); *H01L 33/62* (2013.01); *H01L 31/0224* (2013.01); *H01L 31/186* (2013.01); *H01L 33/0079* (2013.01); *H01L 33/20* (2013.01); *H01L 2924/0002* (2013.01); *H01L 2933/0016* (2013.01); *H01L 2933/0025* (2013.01); *Y02P 70/521* (2015.11)

(58) Field of Classification Search
CPC . H01L 29/66136; H01L 29/861; H01L 33/14; H01L 33/0062; H01L 33/007; H01L 33/0083; H01L 33/0091; H01L 33/08; H01L 33/46; H01L 33/62; H01L 33/44
See application file for complete search history.

(56) References Cited

U.S. PATENT DOCUMENTS

| | | |
|---|---|---|
| RE43,411 E | 5/2012 | Lin et al. |
| 2002/0139987 A1 | 10/2002 | Collins et al. |
| 2005/0255663 A1 | 11/2005 | Natori et al. |
| 2005/0274956 A1 | 12/2005 | Bhat |
| 2006/0099826 A1 | 5/2006 | Ohashi |
| 2008/0241421 A1 | 10/2008 | Chen et al. |
| 2009/0283787 A1 | 11/2009 | Donofrio et al. |
| 2010/0062554 A1 | 3/2010 | Kim |
| 2010/0081256 A1 | 4/2010 | Uemura et al. |
| 2010/0171135 A1 | 7/2010 | Engl et al. |
| 2010/0248407 A1 | 9/2010 | Umemura et al. |
| 2011/0001144 A1 | 1/2011 | Fujikawa et al. |
| 2011/0260205 A1 | 10/2011 | Moosburger et al. |
| 2011/0272728 A1 | 11/2011 | Rode et al. |
| 2012/0018764 A1* | 1/2012 | Choi ...................... H01L 33/54 257/99 |

FOREIGN PATENT DOCUMENTS

| | | |
|---|---|---|
| DE | 10147791 A1 | 4/2003 |
| DE | 10 2007 022 947 A1 | 10/2008 |
| DE | 102007057672 A1 | 6/2009 |
| DE | 102008022942 A1 | 11/2009 |
| DE | 102009030243 A1 | 5/2010 |
| DE | 10 2009 006 177 A1 | 6/2010 |
| EP | 2357679 A2 | 8/2011 |
| JP | 2002-359402 A | 12/2002 |
| JP | 2005505133 A | 2/2005 |
| JP | 2005-327847 A | 11/2005 |
| JP | 2005-340849 A | 12/2005 |
| JP | 2006-135229 A | 5/2006 |
| JP | 2007-221175 A | 8/2007 |
| JP | 2007-523483 A | 8/2007 |
| JP | 2007-287849 A | 11/2007 |
| JP | 2009-188240 A | 8/2009 |
| JP | 2010067984 A | 3/2010 |
| JP | 2011520270 A | 7/2011 |
| JP | 2012527116 A | 11/2012 |
| KR | 2010-0054756 A | 5/2010 |
| TW | 201030971 A | 8/2010 |
| WO | WO-2009/135457 A1 | 11/2009 |
| WO | WO-2010056083 A2 | 5/2010 |

\* cited by examiner

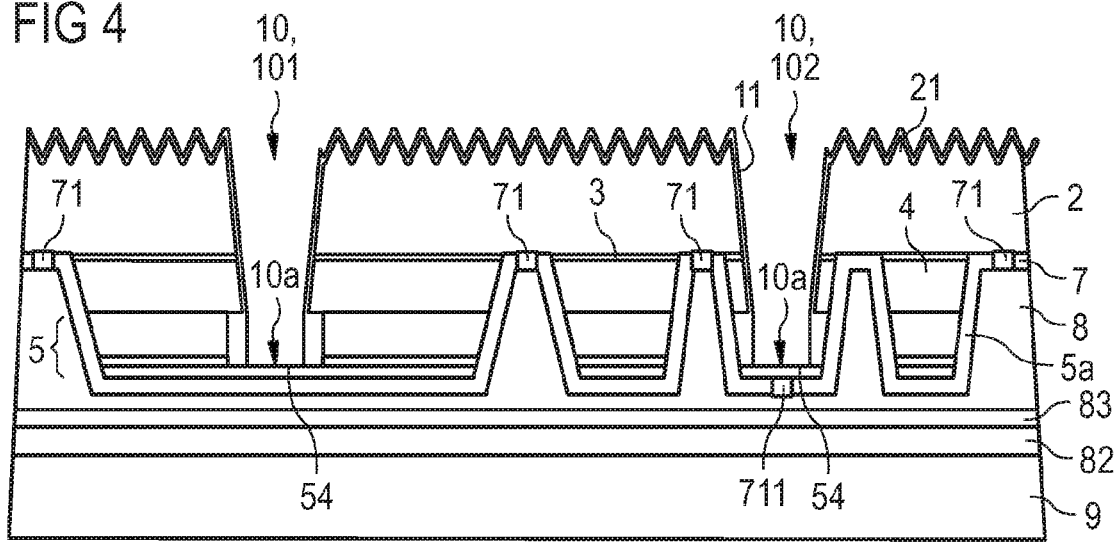
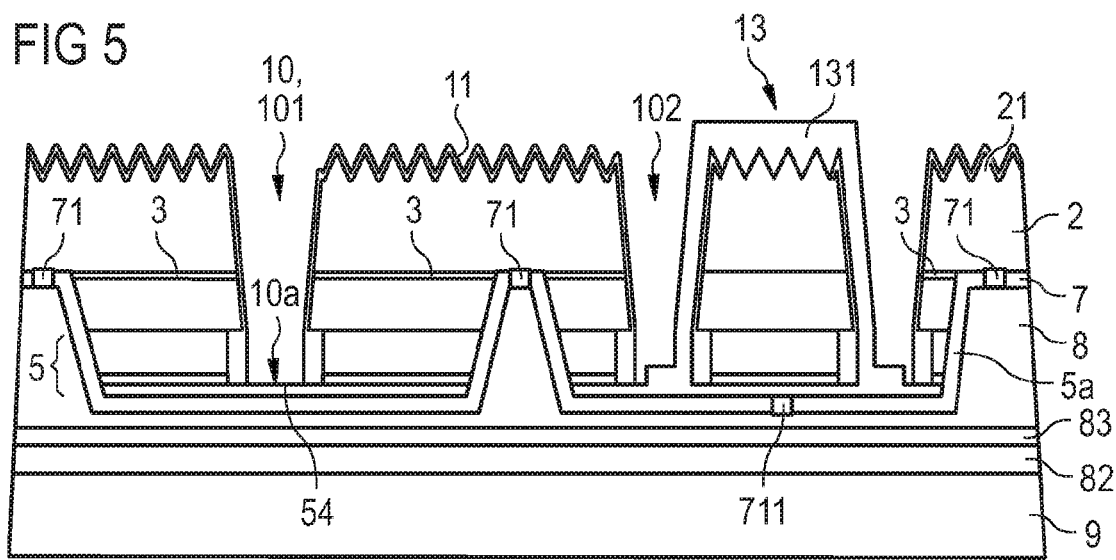

METHOD FOR PRODUCING AN OPTOELECTRONIC SEMICONDUCTOR CHIP, AND OPTOELECTRONIC SEMICONDUCTOR CHIP

CROSS-REFERENCE TO RELATED APPLICATIONS

The present application is a divisional of U.S. patent application Ser. No. 13/704,600 filed on Feb. 20, 2013, which is the National Phase of International Application No. PCT/EP2011/058653 filed on May 26, 2011, which claims the benefit of German Patent Application No. 102010024079.6 filed on Jun. 17, 2010, all of which are hereby incorporated by reference in their entirety for all purposes.

DESCRIPTION

Method for producing an optoelectronic semiconductor chip, and optoelectronic semiconductor chip A method for producing an optoelectronic semiconductor chip is specified. Furthermore, an optoelectronic semiconductor chip is specified.

One object to be achieved consists in specifying a method for producing an optoelectronic semiconductor chip in a particularly cost-effective manner. Furthermore, one object to be achieved consists in specifying an optoelectronic semiconductor chip which can be produced in a particularly simple and hence cost-effective manner.

In accordance with at least one embodiment of the method for producing an optoelectronic semiconductor chip, the method comprises the following steps:

In a first method step, for example, an n-conducting layer is provided. The n-conducting layer is formed with an n-doped semiconductor material, for example. The n-conducting layer can be deposited epitaxially onto a growth substrate, for example.

In a subsequent method step, for example, a p-conducting layer is arranged on the n-conducting layer. The p-conducting layer is formed by a p-doped semiconductor layer, for example, which is likewise deposited epitaxially.

Preferably, at least one active zone provided for receiving and/or for emitting electromagnetic radiation during the operation of the optoelectronic semiconductor chip is formed between the n-conducting layer and the p-conducting layer.

The semiconductor layers of the optoelectronic semiconductor chip, that is to say, for example, the n-conducting layer, the p-conducting layer and the active zone, are based on a nitride semiconductor, for example, in the present case. That means that the layers or at least parts thereof, in particular also the active zone, comprise a nitride compound semiconductor material such as $Al_nGa_mIn_{1-n-m}N$ or consist of said material, where $0 \leq n \leq 1$, $0 \leq m \leq 1$ and $n+m \leq 1$. In this case, said material need not necessarily have a mathematically exact composition according to the above formula. Rather, it can comprise, for example, one or more dopants and additional constituents. For the sake of simplicity, however, the above formula only includes the essential constituents of the crystal lattice, even if these can be replaced and/or supplemented in part by small amounts of further substances.

In accordance with at least one embodiment of the method, in a further method step, a metal layer sequence is arranged on the p-conducting layer. In this case, the metal layer sequence can be deposited directly on the p-conducting layer, but it is also possible for one or a plurality of intermediate layers to be arranged between the metal layer sequence and the p-conducting layer.

In accordance with at least one embodiment of the method, the metal layer sequence comprises at least one mirror layer and at least one barrier layer, wherein the mirror layer of the metal layer sequence faces the p-conducting layer. The mirror layer of the metal layer sequence is formed with silver, for example, that is to say that in this case the mirror layer contains silver or consists of silver. The barrier layer can directly succeed the mirror layer at its surface remote from the p-conducting layer. The barrier layer serves, for example, to inhibit or to suppress diffusion of silver. The barrier layer in particular also suppresses the diffusion of other materials into the mirror layer. By way of example, the barrier layer contains or consists of TiWN or TiN. Furthermore, it is possible for the barrier layer to contain or consist of a transparent conductive oxide. By way of example, the barrier layer then contains ZnO or the barrier layer consists of ZnO.

In accordance with at least one embodiment of the method, a mask is arranged at that side of the metal layer sequence which is remote from the p-conducting layer. The mask is patterned from a photoresist, for example, and can have closed regions, in which it covers the metal layer sequence, and open regions, in which the metal layer sequence is freely accessible.

In accordance with at least one embodiment of the method, the metal layer sequence is removed in places using the mask, for example in places where the metal layer sequence is not covered by the mask. As a result of this removal, the p-conducting layer is uncovered at the places at which the metal layer sequence is removed. By way of example, the metal layer sequence is patterned wet-chemically or by back-sputtering.

In accordance with at least one embodiment of the method, the uncovered regions of the p-conducting layer are neutralized or removed in places. In this case, the neutralization or removal takes place without a further mask being defined. Rather, the mask already used for the patterning of the metal layer sequence is used for the neutralization or removal of the uncovered regions of the p-conducting layer. Alternatively, it is possible for the non-removed regions of the metal layer sequence to be used as a mask for the patterning of the p-conducting layer.

What is important in this case is that the patterning of the metal layer sequence and the patterning of the p-conducting layer are effected without the definition of a further mask between the two method steps, that is to say that the patterning of the metal layer sequence and the patterning of the p-conducting layer are effected by means of the same phototechnique. Advantageously, therefore, the patterning of the p-conducting layer is self-aligning with respect to the metal layer sequence that has already been patterned. Overall, dispensing with a further phototechnique proves to be a possibility for reducing the production outlay for the production of the optoelectronic semiconductor chip, which leads to reduced costs in the production of the optoelectronic semiconductor chip.

The uncovered regions of the p-conducting layer are neutralized or removed by back-sputtering with Ar ions and/or hydrogen ions, for example. During the neutralization of the p-conducting layer, the p-type dopant in the p-conducting layer is neutralized, such that the neutralized regions of the p-conducting layer are electrically insulated. The uncovered regions of the p-conducting layer are neutralized or removed as far as the n-conducting layer, such that it becomes possible to make contact with the latter via the neutralized or removed regions.

In the case of the removal of the p-conducting layer, contact can be made at the n-conducting layer directly. In the case of the neutralization of the p-conducting layer, the neutralized region of the p-conducting layer can be doped in n-conducting fashion in places, for example, such that contact is made with the n-conducting layer through the neutralized region. During the neutralization or removal of the uncovered regions of the p-conducting layer, an edge is produced in the p-conducting layer adjoining the neutralized or removed regions. An angle of the edge of, for example, approximately 60° with respect to the underlying n-conducting layer is established during the removal of the p-conducting layer. In particular, the edge then does not run perpendicularly to the underlying n-conducting layer.

Furthermore, an optoelectronic semiconductor chip is specified. The optoelectronic semiconductor chip can be produced by the method described here. That is to say that the features disclosed for the method are also disclosed for the optoelectronic semiconductor chip, and vice versa.

In accordance with at least one embodiment of the optoelectronic semiconductor chip, the optoelectronic semiconductor chip comprises the metal layer sequence, which comprises at least one mirror layer and a barrier layer, and the p-conducting layer. In this case, the mirror layer of the metal layer sequence faces the p-conducting layer and the p-conducting layer laterally projects beyond the mirror layer. In other words, the mirror layer is set back in a lateral direction relative to the p-conducting layer. In this case, "laterally" or "lateral direction" denotes directions running for example perpendicularly to a growth direction of the epitaxially produced layers.

The lateral overhang of the p-conducting layer beyond the mirror layer is, for example, at most 5 μm, preferably at most 3 μm, for example at most 2 μm.

The fact that the p-conducting layer projects beyond the mirror layer at least in places is caused by the fact that the removal of the metal layer sequence and the neutralization or removal of those regions of the p-conducting layer that are uncovered by the removal are effected in one work step, for example using the same mask.

It is possible for the overhang of the p-conducting layer with respect to layers of the metal layer sequence other than the mirror layer to be smaller than the overhang with respect to the mirror layer. By way of example, the barrier layer can laterally project beyond the mirror layer of the metal layer sequence, such that the p-conducting layer laterally projects beyond the barrier layer by a smaller amount than the mirror layer or the barrier layer and the p-conducting layer even terminate flush with one another at least in places. By way of example, the barrier layer laterally projects beyond the mirror layer, wherein the overhang of the barrier layer beyond the mirror layer is at most 1 μm. The overhang of the barrier layer beyond the mirror layer can be caused, for example, by the fact that an etchant for patterning the metal layer sequence attacks the mirror layer to a greater extent than the barrier layer.

The p-conducting layer preferably projects beyond the mirror layer along all edges of the p-conducting layer at which the latter adjoins regions in which the p-conducting layer is removed or neutralized.

Embodiments are specified below which relate both to the method described here for producing an optoelectronic semiconductor chip and to the optoelectronic semiconductor chip described here. That is to say that the following features are disclosed both for the method and for the optoelectronic semiconductor chip.

In accordance with at least one embodiment, an opening is formed which extends through the n-conducting layer and the p-conducting layer. That is to say that the n-conducting layer and the p-conducting layer are removed in places in the region of the opening. By way of example, the opening extends, proceeding from the n-conducting layer, through the p-conducting layer as far as the metal layer sequence, such that a layer of the metal layer sequence is uncovered at a bottom area of the opening. By way of example, in this case the opening can taper from the n-conducting layer in the direction towards the metal layer sequence. A connection pad for making electrical contact with the semiconductor chip is formed at the bottom area of the opening, that is to say towards the uncovered layer of the metal layer sequence. In other words, a layer of the metal layer sequence can serve as a connection pad (so-called bonding pad) for making electrical contact with the semiconductor chip. In this case, it is also possible for a metallization to be applied directly on the layer of the metal layer sequence, said metallization forming the connection pad. At all events, the metal layer sequence, that is to say at least the uncovered layer of the metal layer sequence, serves for impressing and, if appropriate, distributing current in the optoelectronic semiconductor chip. In this way, it is possible to dispense with the separate definition of a connection pad during the method for producing the optoelectronic semiconductor chip, which in turn leads to a reduction of the production outlay and thus to particularly cost-effective production of the optoelectronic semiconductor chip.

In accordance with at least one embodiment, the opening at least partly extends through the mirror layer of the metal layer sequence, wherein side areas of the opening are completely covered by a passivation layer at least in the region of the mirror layer. That is to say that the mirror layer of the metal layer sequence can be removed in the region of the opening. By way of example, the barrier layer or a further layer of the metal layer sequence is then uncovered at the bottom area of the opening. In order to protect the mirror layer against harmful atmospheric gases and moisture, in the present case the regions of the mirror layer that are uncovered in the region of the opening are to be completely covered with a passivation layer. By way of example, the passivation layer is produced in this case by means of an ALD (Atomic Layer Deposition) process. An ALD method is particularly well suited to the conformal reshaping of the mirror layer, without the occurrence, in the passivation layer, of channels through which material can pass from the mirror layer towards the outside or towards the mirror layer. That is to say that the passivation layer produced in this way protects the mirror against harmful substances such as, for example, gases and/or moisture. Furthermore, the passivation layer impedes or prevents the migration of constituents of the mirror layer—for example silver ions—into adjoining regions of the semiconductor chip.

In this case, the production of the passivation layer by means of an ALD process can be unambiguously differentiated from passivation layers produced by other production processes such as CVD (Chemical Vapour Deposition), for example, by means of micrographs recorded by an electron microscope, for example. Therefore, the feature that the passivation layer is produced by means of an ALD process is also a substantive feature and not a pure method feature.

In accordance with at least one embodiment, the p-conducting layer laterally projects beyond the mirror layer in the opening. In this case, the p-conducting layer preferably laterally circumferentially projects beyond the mirror layer with an overhang of at least 500 nm, for example 1 µm, at most 4 µm for example. If the passivation layer is produced by means of an ALD process, then the passivation extends under the overhang of the p-conducting layer beyond the mirror layer as far as the mirror layer itself and covers the latter in a positively locking manner.

In this case, it is possible for the cavity formed by the overhang of the p-conducting layer beyond the mirror layer to be completely filled with the material of the passivation layer. Particularly when using an ALD process for producing the passivation layer, however, it is also possible for a hollow groove to form below the p-conducting layer. The passivation layer then has a U-shaped cross section, for example. It completely covers the p-conducting layer in the region of the overhang at its side facing the metal layer sequence, the mirror layer in the region of the side area of the opening and the uncovered layer of the metal layer sequence which faces the p-conducting layer in the region of the overhang.

In accordance with at least one embodiment, the side area of the opening in the region of the mirror layer forms, with that surface of a carrier of the semiconductor chip which faces the mirror layer, a different angle from the side area of the opening in the region of the p-conducting layer.

For example, the side area of the opening in the region of the mirror layer runs perpendicularly to the surface of the carrier, whereas the side area of the opening in the region of the p-conducting layer forms an angle of not equal to 90° with the surface of the carrier. For example, the opening is embodied in cylindrical fashion or in parallelepipedal fashion in the region of the metal layer sequence and in truncated-cone-shaped fashion or in truncated-pyramid-shaped fashion otherwise. Lateral projection beyond the mirror layer by the p-conducting layer in the opening can be realised in a particularly simple manner in this way.

In accordance with at least one embodiment, a thickness of the passivation layer is between 20 nm and 100 nm inclusive, in particular between 35 nm and 70 nm inclusive. In this case, the thickness of the passivation layer is to be measured, in particular, in a direction parallel to a growth direction of the passivation layer. If the passivation layer has a plurality of partial regions grown together, then the thickness is to be determined, in particular, in each case for the individual partial regions, for example as far as a seam at which the individual partial regions adjoin one another. The mirror layer preferably has a thickness of between 100 nm and 200 nm inclusive, in particular between 100 nm and 150 nm inclusive.

In accordance with at least one embodiment, the passivation layer comprises or consists of a silicon oxide, an aluminium oxide and/or a zirconium oxide. The passivation layer can equally comprise or consist of one of the following materials: $TiO_2$, $HfO_2$, $SnO_2$, $SiC$, $Zr(SiO_4)$, $Pb_3(Si_2O_7)$, $Na(AlSiO_4)$, $Si_3N_4$, AlN, GaN. Other transparent, moisture-stable oxides, carbides and/or nitrides can also be used for the passivation layer.

In accordance with at least one embodiment, at least two openings are formed which extend through the n-conducting layer and the p-conducting layer to a layer of the metal layer sequence. A connection pad for making contact with the semiconductor chip on the n-side is formed in one of the openings, and a connection pad for making contact with the semiconductor chip on the p-side is formed in another of the openings. In other words, in this embodiment, contact is made with the semiconductor chip through at least two openings. The connection pads differ by virtue of their electrical connection to differently conducting regions of the optoelectronic semiconductor chip.

In accordance with at least one embodiment, side areas of the metal layer sequence apart from the opening or openings at least indirectly adjoin a metal layer that is electrically conductively connected to the n-conducting semiconductor material. In this case, at least indirectly means that an electrically insulating insulation layer can be arranged between the metal layer sequence and the metal layer which is electrically conductively connected to the n-conducting semiconductor material. However, said insulation layer is not uncovered for example at the edges of the optoelectronic semiconductor chip, but rather is surrounded circumferentially, that is to say at all edges of the semiconductor chip, by the metal layer which is electrically conductively connected to the n-conducting semiconductor material. In this way, the metal layer sequence with the mirror layer is circumferentially encapsulated by the metallic n-type contact, which leads to a mechanically and chemically particularly stable optoelectronic semiconductor chip. Only in the region of the openings is the mirror layer of the metal layer sequence not metallically encapsulated, but rather covered for example by the passivation layer mentioned above.

In accordance with at least one embodiment, at least one of the openings which extends from the n-conducting layer as far as a layer of the metal layer sequence is laterally completely surrounded by the active zone of the optoelectronic semiconductor chip. Preferably, all the openings are laterally completely surrounded by the active zone. That is to say that the opening or the openings via which electrical contact is made with the optoelectronic semiconductor chip is or are surrounded by luminous area of the optoelectronic semiconductor chip in the case of a radiation-emitting optoelectronic semiconductor chip. A distribution of the electric current for generating radiation in the active zone is preferably effected for the most part or completely below the active zone, such that the optoelectronic semiconductor chip has a particularly large emission area.

In accordance with at least one embodiment, the semiconductor chip has an ESD partial region, which comprises parts of the metal layer sequence, of the p-conducting layer and of the n-conducting layer. In this case, the ESD partial region is electrically connected in antiparallel with the rest of the semiconductor chip. That is to say that, in the semiconductor chip, by means of the patterning of the metal layer sequence, of the p-conducting layer and of the n-conducting layer, an ESD partial region is formed, which forms a diode which is connected in antiparallel with the rest of the semiconductor chip and thus acts as an ESD protective diode for the rest of the semiconductor chip. Preferably, the ESD partial region is in this case laterally completely surrounded by the active zone, such that the ESD partial region is situated within the luminous area in the case of a radiation-emitting optoelectronic semiconductor chip. During the operation of the optoelectronic semiconductor chip, no electromagnetic radiation is generated in the ESD partial region, but rather around the ESD partial region.

In accordance with at least one embodiment, the semiconductor chip is subdivided into at least two active partial regions which are electrically connected in series. In other words, the semiconductor chip comprises at least two pixels, the active partial regions, which, in principle, can be operated independently of one another. In the optoelectronic semiconductor chip, the partial regions are electrically connected in series, such that the semiconductor chip has, for example, a single n-type connection location and a single p-type connection location.

In accordance with at least one embodiment, at least one electrical connection between the active regions is arranged below the radiation exit area of the semiconductor chip. That is to say that the interconnection of the active partial regions of the semiconductor chip in series is not effected outside the optoelectronic semiconductor chip or above the radiation exit area, that is to say in the beam path of the optoelectronic semiconductor chip, but rather below the radiation exit area. In this case, preferably all electrical connections between the active partial regions of the semiconductor chip are arranged below the radiation exit area.

In accordance with at least one embodiment of the optoelectronic semiconductor chip, a voltage of at least 2 V is dropped in each active partial region during the operation of the semiconductor chip. Preferably, a voltage of at least 3 V is dropped across each active partial region. If the semiconductor chip has 28 active partial regions, for example, then the semiconductor chip is operated with a voltage of approximately 90 V, wherein a current of approximately 0.6 mA can flow through the semiconductor chip. Such an optoelectronic semiconductor chip comprising a plurality of active partial regions which are connected in series with one another can also be operated with commercially available AC current after rectification and smoothing given a suitable choice of the number of active partial regions. Furthermore, it is possible for the semiconductor chip to comprise a first group of pixels, which are connected in series with one another, and a second group of pixels, which are connected in series with one another, wherein the first and second groups are connected in antiparallel with one another. In this case, it is possible to operate the semiconductor chip with AC current directly, without rectification.

The method described here and the optoelectronic semiconductor chip described here are explained in greater detail below on the basis of exemplary embodiments and the associated figures.

FIG. 4 illustrates a schematic sectional view of an optoelectronic semiconductor chip according to an exemplary embodiment.

FIG. 5 illustrates a further schematic sectional view of an optoelectronic semiconductor chip according to an exemplary embodiment.

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

Various method steps of an exemplary embodiment of a method for producing an optoelectronic semiconductor chip described here are explained in greater detail with reference to the schematic sectional illustrations in FIGS. 1A to 1O. The schematic sectional illustration in FIG. 1O then shows the optoelectronic semiconductor chip produced by means of the method, in a first embodiment.

Figure 1A:
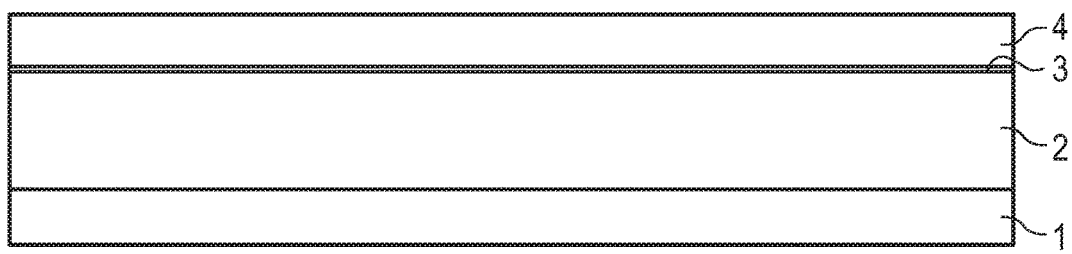
FIGS. 1A to 1O illustrate schematic sectional views of a method described herein according to a first exemplary embodiment, with the schematic sectional view of FIG. 1O illustrating an optoelectronic semiconductor chip.

As illustrated in FIG. 1A, firstly an n-conducting layer 2 is applied, for example deposited epitaxially, onto a growth substrate 1. The growth substrate 1 is formed from sapphire, for example. The n-conducting layer 2 is an n-doped GaN layer, for example. The n-conducting layer 2 is succeeded by a p-conducting layer 4. The p-conducting layer 4 is a p-doped GaN layer, for example. An active zone 3 is formed at the interface between n-conducting layer 2 and p-conducting layer 4, said active zone comprising, for example, a pn junction, a single or a multiple quantum well structure. The active layer 3 is preferably suitable for emitting electromagnetic radiation from the spectral range of visible light during the operation of the optoelectronic semiconductor chip to be produced.

In a subsequent method step, the metal layer sequence 5 is applied to that side of the p-conducting layer 4 which is remote from the n-conducting layer 2. In the present case, the metal layer sequence 5 comprises a mirror layer 51, which consists of silver, for example. Furthermore, the metal layer sequence 5 comprises a barrier layer 52, which, for example, consists of TiWN or TiN or ZnO or contains one or more of these materials. Optionally, the metal layer sequence 5 comprises a reinforcing layer 53, which contains at least one of the following metals or consists of one of said metals: gold, titanium, chromium. The reinforcing layer 53 serves to ensure a sufficient current spreading through the metal layer sequence 5 in the optoelectronic semiconductor chip to be produced.

A mask 6 is subsequently formed on the top side of the metal layer sequence 5 remote from the p-conducting layer 4, said mask being formed with a photoresist, for example.

Figure 1B:
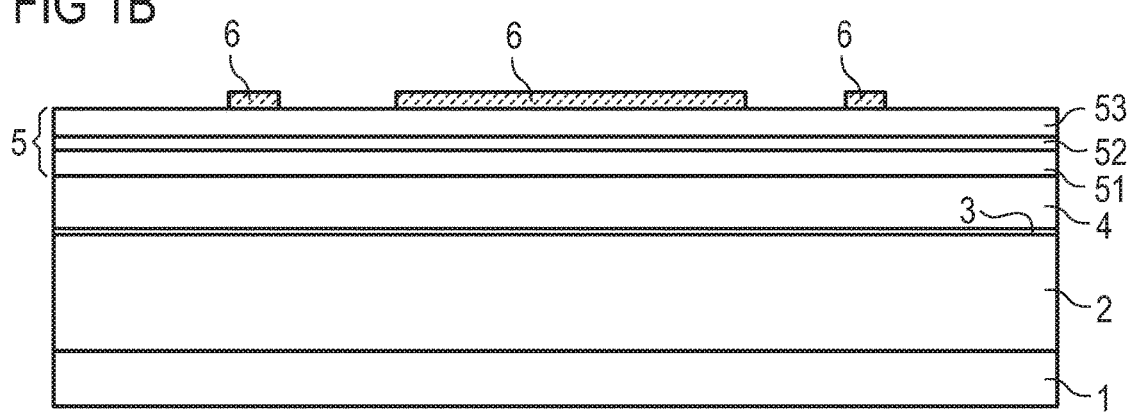
Figure 1C:
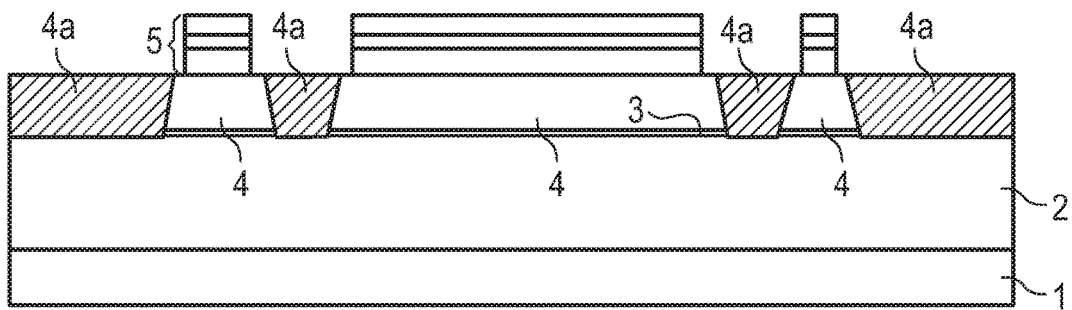
Figure 1D:
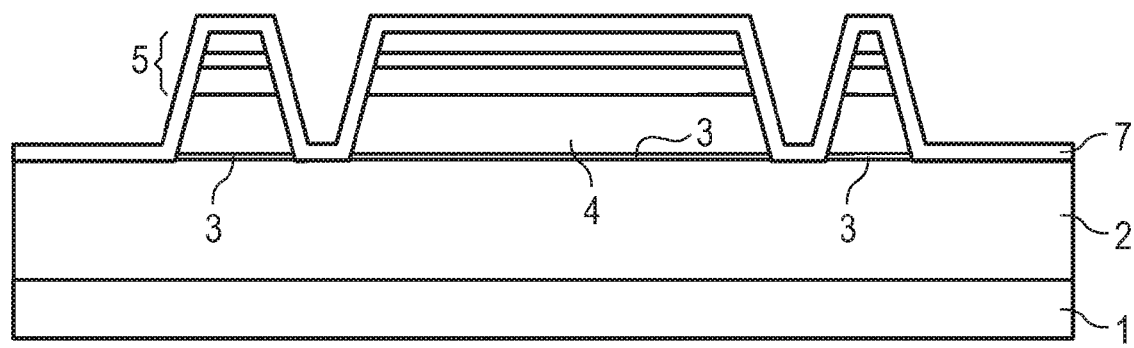

As becomes evident from FIG. 1C, a patterning of the metal layer sequence 5 and of the p-conducting layer 4 is subsequently carried out with the aid of the mask 6. The metal layer sequence 5 is patterned wet-chemically or by means of back-sputtering.

The patterning of the p-conducting layer 4 is also effected with the aid of the same phototechnique as the patterning of the metal layer sequence 5. That is to say that the mask 6 is used for patterning the metal layer sequence 5 and the p-conducting layer 4. As a result, the patterning of the p-conducting layer 4 is a self-aligning process which does not necessitate the definition of an additional mask for carrying out said process. The patterning of the p-conducting layer 4 is effected, for example, by neutralizing the regions 4a freed of the metal layer sequence 5 to form neutralized regions. Alternatively, the p-conducting layer 4 can also be removed in the regions freed of the metal layer sequence 5. The neutralization or removal is effected by back-sputtering by means of argon ions or hydrogen ions for a time duration of less than two minutes, for example. By means of the patterning of the p-conducting layer 4 as far as the n-conducting layer 2, edges of the p-conducting layer 4 are produced which are inclined at an angle of 60° for example with respect to the plane of the growth area of the growth substrate 1.

Figure 3:
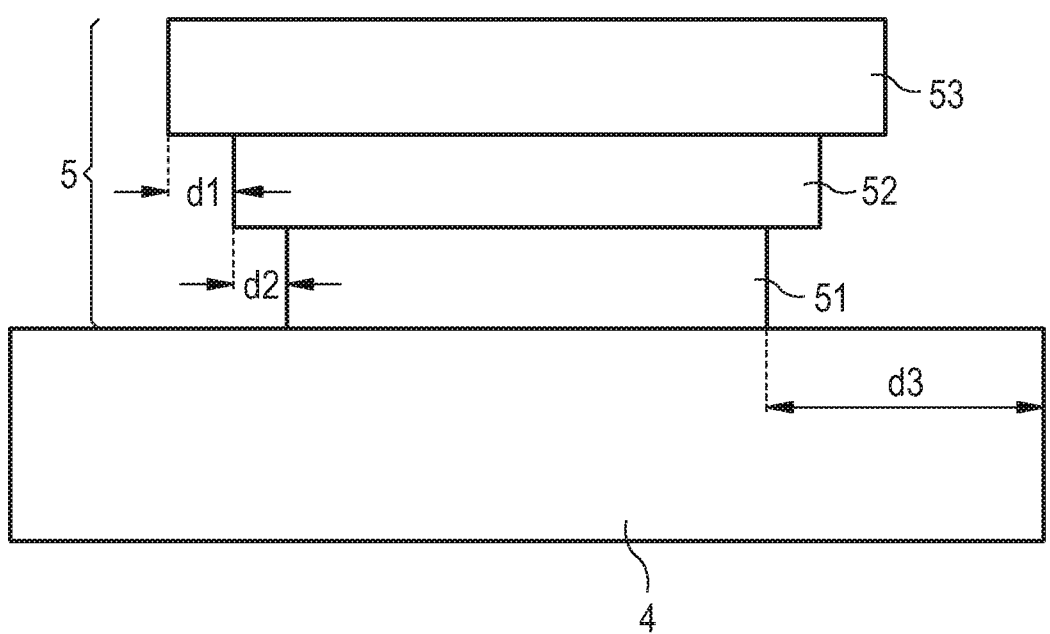
FIG. 3 illustrates a schematic sectional view of a feature of optoelectronic semiconductor chips according to an exemplary embodiment.

Part of the patterned metal layer sequence 5 with adjoining p-conducting layer 4 is illustrated in greater detail on the basis of the schematic sectional illustration in FIG. 3. As a result of the patterning of the metal layer sequence 5, the latter can have the form of an inverted stepped pyramid, wherein the reinforcing layer 53 projects beyond the barrier layer 52 circumferentially by the overhang d1. The barrier layer 52 projects laterally, that is to say in a lateral direction, circumferentially beyond the mirror layer 51 by the amount d2. By way of example, the overhangs d1 and d2 are in each case at most 1 μm. A patterning of the metal layer sequence into an inverted stepped pyramid as illustrated in FIG. 3 is effected, in particular, during a wet-chemical patterning of the metal layer sequence 5. On account of the subsequent patterning of the p-conducting layer 4 by means of the same phototechnique as the patterning of the metal layer sequence 5, the p-conducting layer 4 projects laterally circumferentially beyond the mirror layer 51 by the amount d3. In this case, the overhang is preferably at most 2 μm. In this case, the overhang is caused by the production method described in conjunction with FIGS. 1B and 1C, that is to say the patterning of the metal layer sequence 5 and of the p-conducting layer 4 using the same mask 6.

In a subsequent method step, an insulation layer 7 is applied to the surface remote from the growth substrate 1. The insulation layer 7 has a thickness of at most 1 μm and preferably of at least 400 nm, for example 450 nm, and consists of silicon dioxide, for example. The insulation layer 7 is applied by means of a TEOS precursor, for example, which is used in a CVD process in order to improve the overmoulding properties. The insulation layer 7 covers the uncovered regions of the n-conducting layer and all uncovered outer areas of the p-conducting layer, of the active zone 3 and of the metal layer sequence 5 in a positively locking manner.

Figure 1E:
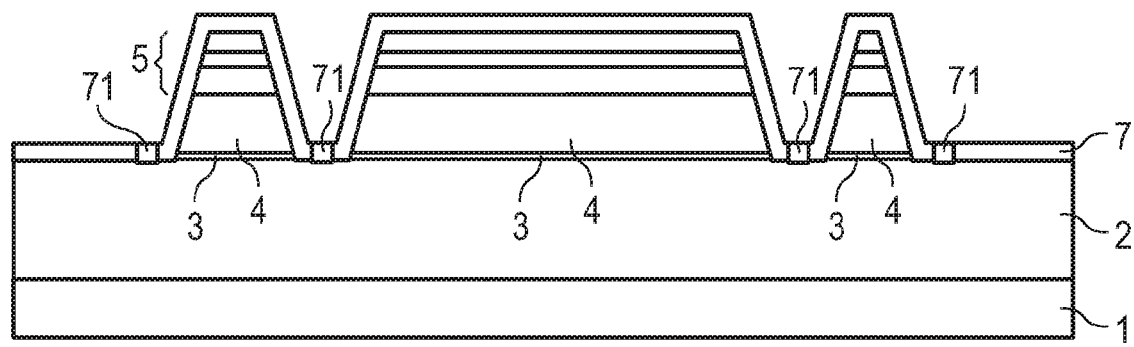

In the method step described in conjunction with FIG. 1E, the insulation layer 7 is opened by the production of openings 71 towards the n-conducting layer 2. The openings can optionally be filled with a metal such as silver, for example, but this can also be effected in a subsequent method step during the application of the metal layer 8. In this case, openings 71 are introduced between the patterned regions of the p-conducting layer 4 and also outside the patterned p-conducting regions 4. The openings 71 in the insulation layer 7 are embodied in ring-shaped fashion, for example. One of the openings 71 completely encloses the active zone 3 and encapsulates the latter completely circumferentially metallically after the introduction of a metal. A mask is defined in order to form the openings 71, that is to say that a further phototechnique is employed.

Figure 1F:
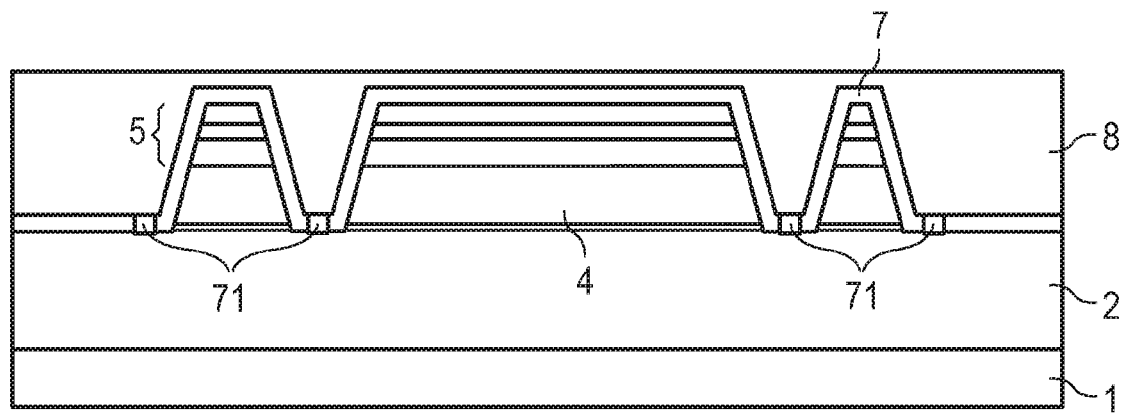
Figure 1G:
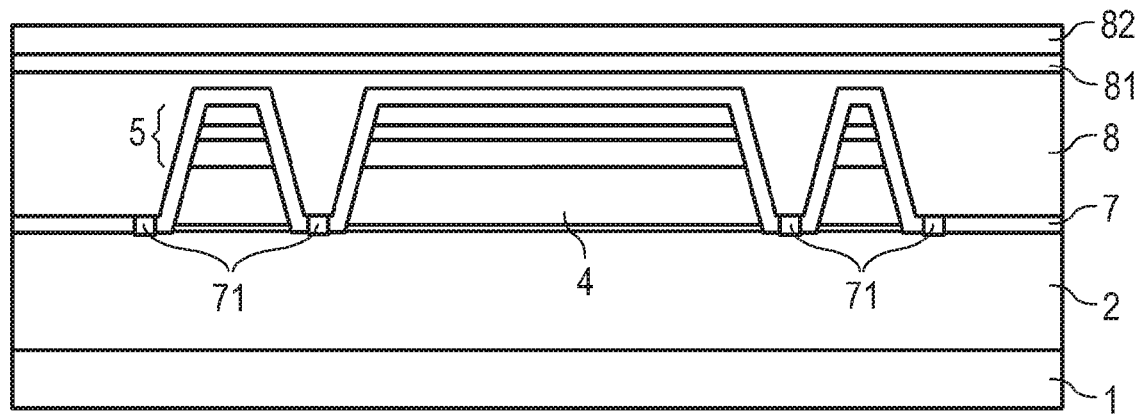
Figure 1H:
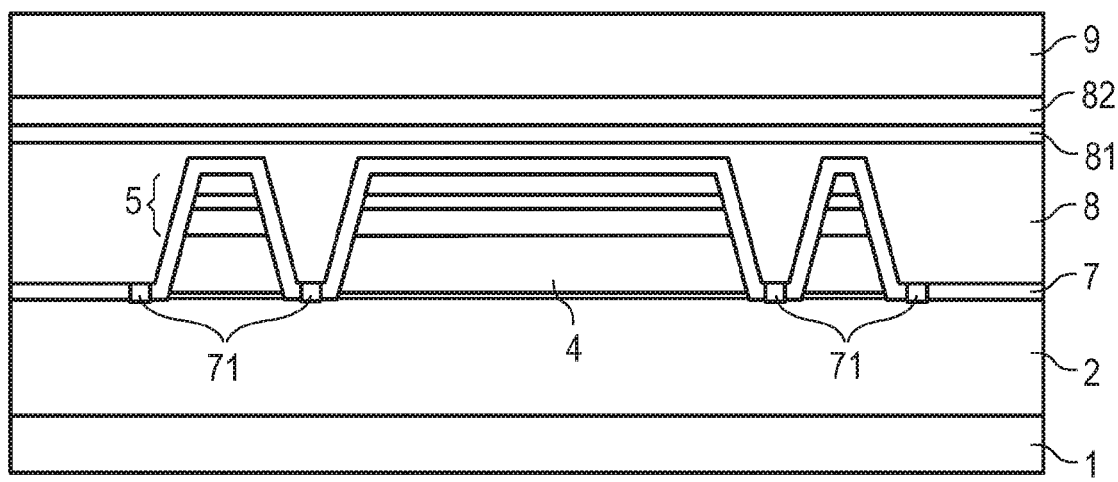

In conjunction with FIG. 1F, a method step is described in which the metal layer 8 is applied to the side remote from the growth substrate 1 by vapour deposition of silver, for example, and in this case completely covers that side of the n-conducting layer which is remote from the growth substrate 1, and completely encloses the active zone 3, the p-conducting layer and the metallic layer sequence 5. Should no metal for making contact with the n-conducting layer have yet been introduced in the openings 71, then the metal layer 8 serves for making contact with the n-conducting layer in the openings 71.

A barrier layer 81 and a reinforcing layer 82 are subsequently applied to that side of the metal layer 8 which is remote from the growth substrate 1. By way of example, the following layer sequence is produced in this way: Ti/TiWN/TiN/TiPtAu. The reinforcing layer 82 preferably contains gold in this case.

The carrier 9 is subsequently applied to that side of the reinforcing layer 82 which is remote from the growth substrate 1. The carrier 9 can be bonded on; furthermore, it is possible for the carrier 9 to be produced by an electrolytic process. In the present case, the carrier 9 is embodied in electrically conductive fashion. The carrier 9 can, for example, be formed with one of the following materials or consist of one of the following materials: germanium, silicon, copper, nickel.

Figure 1I:
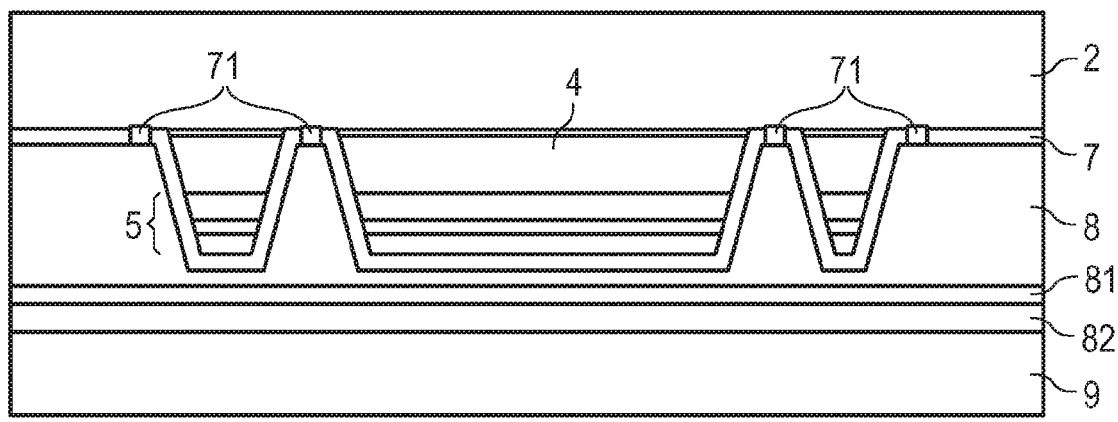

In the subsequent method step described in conjunction with FIG. 1I, the growth substrate 1 is stripped from the n-conducting layer by a laser stripping method or chemo-mechanically.

Figure 1J:
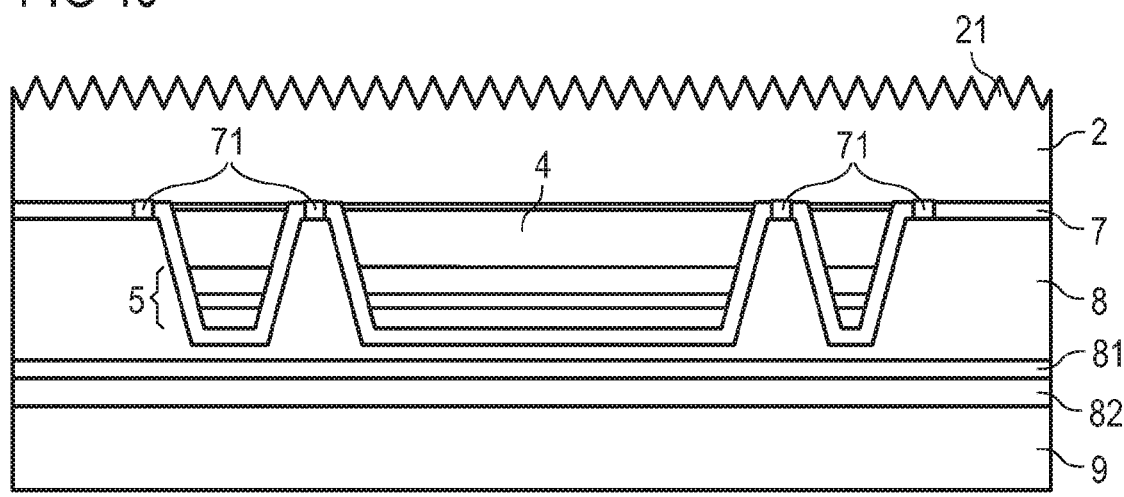

In a further method step, in this respect see FIG. 1J, that surface area of the n-conducting layer 21 which is remote from the carrier 9 can be roughened. That is to say that roughenings are then situated at the radiation exit area 21, said roughenings reducing a probability of total reflection of electromagnetic radiation upon passage through the radiation exit area.

Figure 1K:
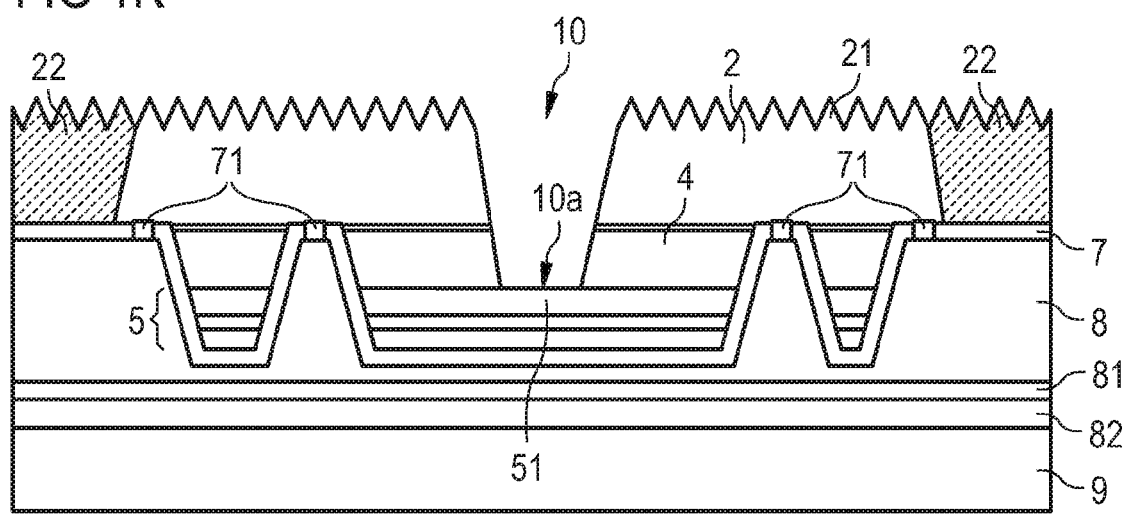
Figure 1L:
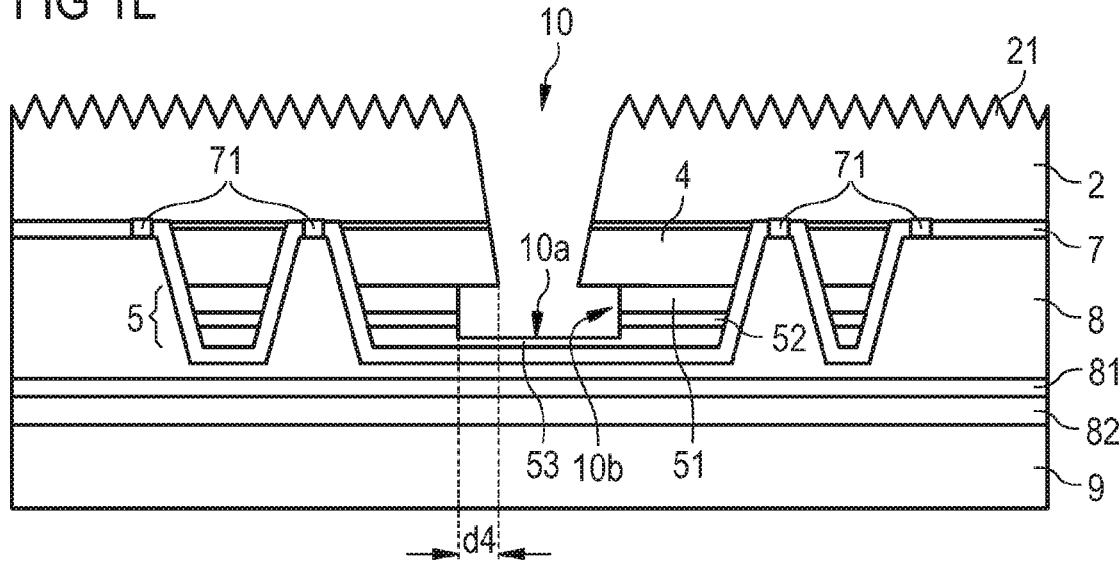

In the method step described in conjunction with FIG. 1K, an opening 10 is produced which extends through the n-conducting layer 2 and the p-conducting layer 4 towards the mirror layer 51 of the metal layer sequence 5. A mesa etch can optionally be effected, wherein the regions 22 are removed. The mesa etch and the production of the opening 10 are effected by means of a mask (not shown) that is to say using a phototechnique. By way of example, hot phosphoric acid is used for patterning, said acid stopping on the insulation layer 7 composed of silicon dioxide and the mirror layer 51 composed of silver. The use of alternative chemicals for patterning is also possible.

A further method step involves the removal of the mirror layer 51 and, if appropriate, the barrier layer 52 at the bottom area 10a of the opening 10. The removal is effected by etching, for example, wherein the semiconductor layers surrounding the opening, that is to say the n-conducting layer 2 and the p-conducting layer 4 and also the active zone 3, are used as a mask. The removal of the mirror layer 51 and, if appropriate, the barrier layer 52 produces an overhang in which the p-conducting layer 4 circumferentially projects beyond the mirror layer 51. The overhang is d4≤4 μm, for example d4=1 μm.

The reinforcing layer 53, which consists of gold or contains gold, for example, is uncovered at the bottom area 10a of the opening 10.

Figure 1M:
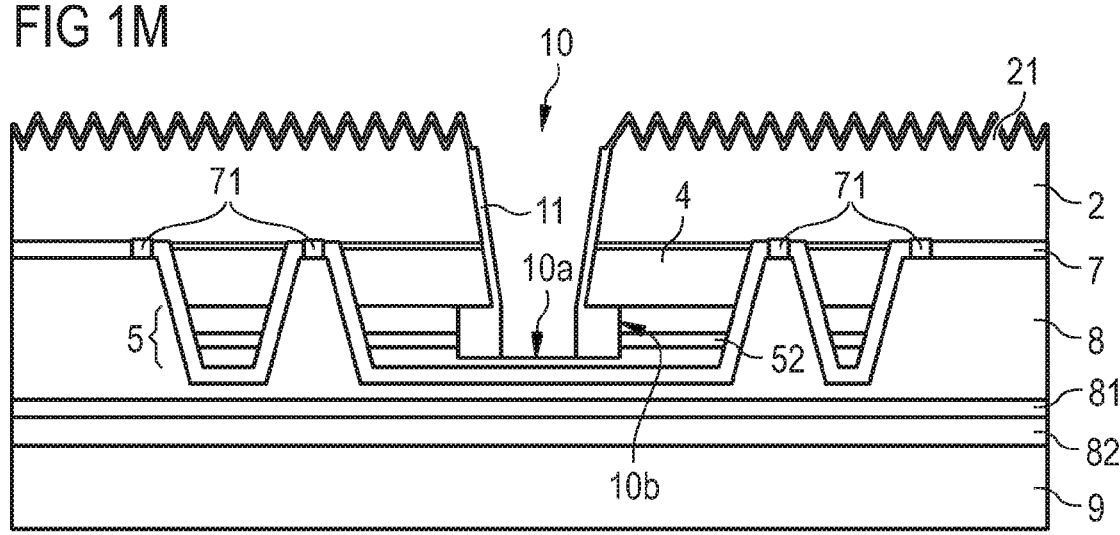

In a subsequent method step, FIG. 1M, the passivation layer 11 is applied to the outer area remote from the carrier 9 by means of an ALD process. The passivation layer 11 can, for example, contain one of the following materials or consist of one of the following materials: an aluminium oxide, a zinc oxide, a titanium oxide, a silicon oxide.

In this case, it is possible for the passivation layer 11 to completely fill the cavity produced by the overhang of the p-conducting layer 4 beyond the mirror layer 51. After the conclusion of the deposition of the passivation layer 11, the bottom area 10a of the opening 10 is also covered with the material of the passivation layer 11.

In a subsequent method step (cf. FIG. 1N), which involves using a phototechnique using a mask, for example, the reinforcing layer 53 is uncovered again at the bottom area 10a of the opening 10, such that a connection pad 54 arises, to which a contact wire (also called bonding wire) can subsequently be fixed.

Figure 1N:
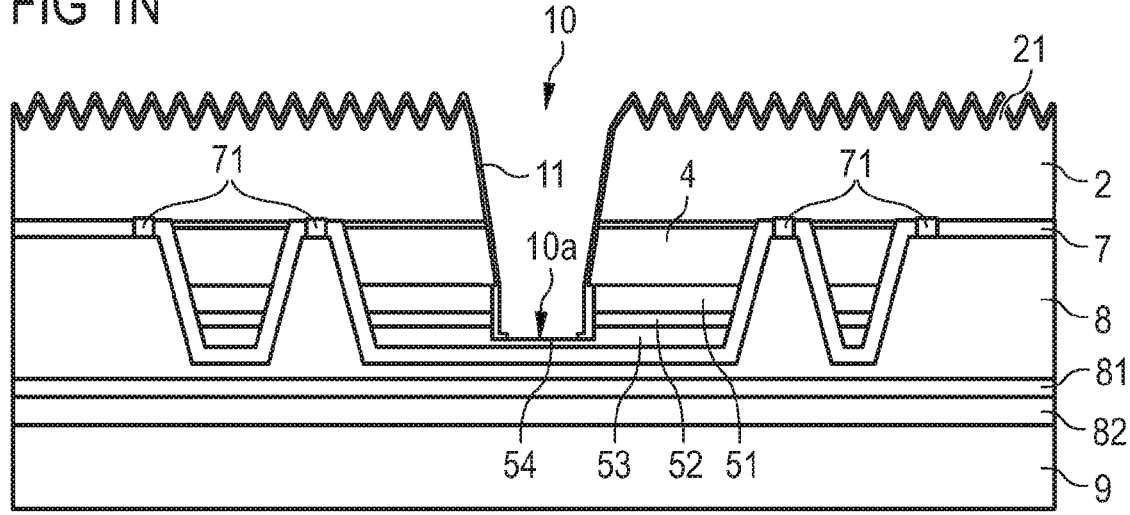
Figure 1O:
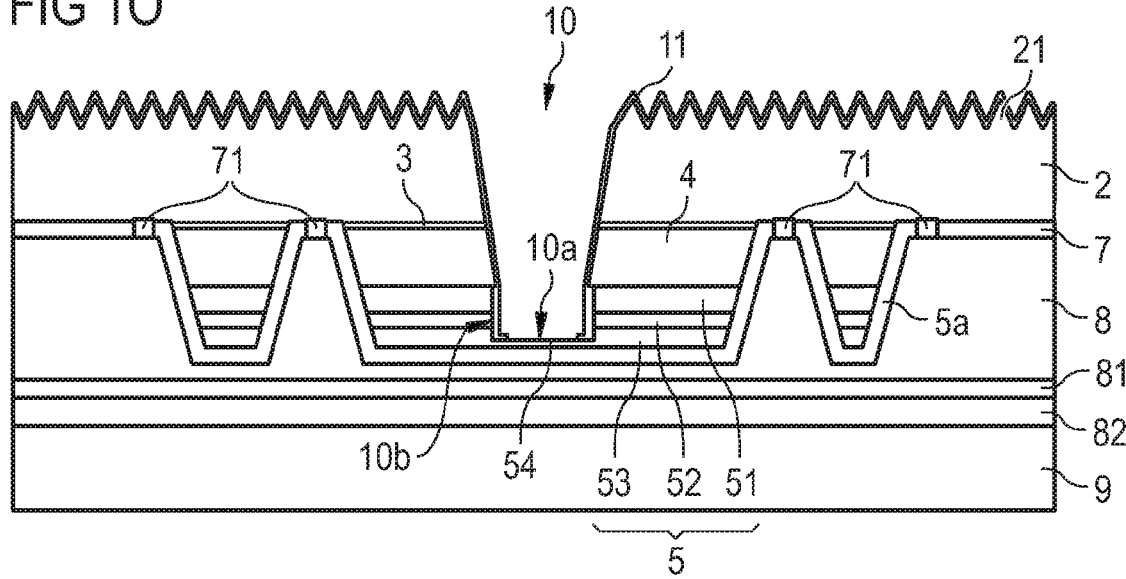

The concluding method step, described in conjunction with FIG. 1O, involves a singulation into individual optoelectronic semiconductor chips. As is evident from FIG. 1O, the optoelectronic semiconductor chip comprises a carrier 9, which is embodied in an electrically conductive fashion. The carrier 9 is succeeded by a reinforcing layer 82, onto which is formed a barrier layer 81 towards the metal layer 8. The metal layer 8 is electrically conductively connected to the n-conducting region 2 of the optoelectronic semiconductor chip through the openings 71. That is to say that the metal layer 8 serves for making contact with the optoelectronic semiconductor chip on the n-side. In this case, apart from the opening 10, the metal layer 8 laterally circumferentially surrounds the metal layer sequence 5 with the mirror layer 51, such that the mirror layer 51 is at least indirectly circumferentially encapsulated metallically by the metal layer 8. The insulation layer 7 is introduced between the metal layer 8 and the metal layer sequence 5 and also the p-conducting layer 4, said insulation layer electrically decoupling the metal layer 8 from the p-conducting layer 4. Electrical contact can be made with the p-conducting layer 4 via the reinforcing layer 53 of the metal layer sequence 5. In the opening 10, in which the reinforcing layer 53 is accessible for making electrical contact with the p-conducting layer 4, the mirror layer 51 is completely covered and encapsulated by means of the passivation layer 11 at the side areas 1b of the opening 10.

Overall, the optoelectronic semiconductor chip described in conjunction with FIG. 1O can be produced by only four phototechniques (in this respect, cf. the description of FIGS. 1B, 1E, 1K and 1N).

Figure 2A:
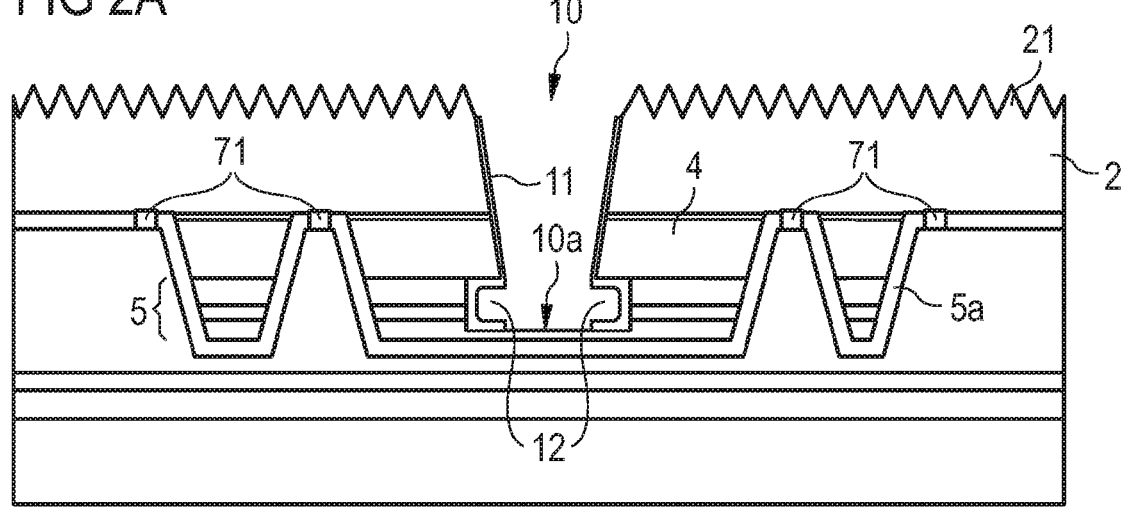
FIGS. 2A and 2B illustrate schematic sectional views of a method described herein according to a further exemplary embodiment, with the schematic sectional view of FIG. 2B illustrating an optoelectronic semiconductor chip.
Figure 2B:
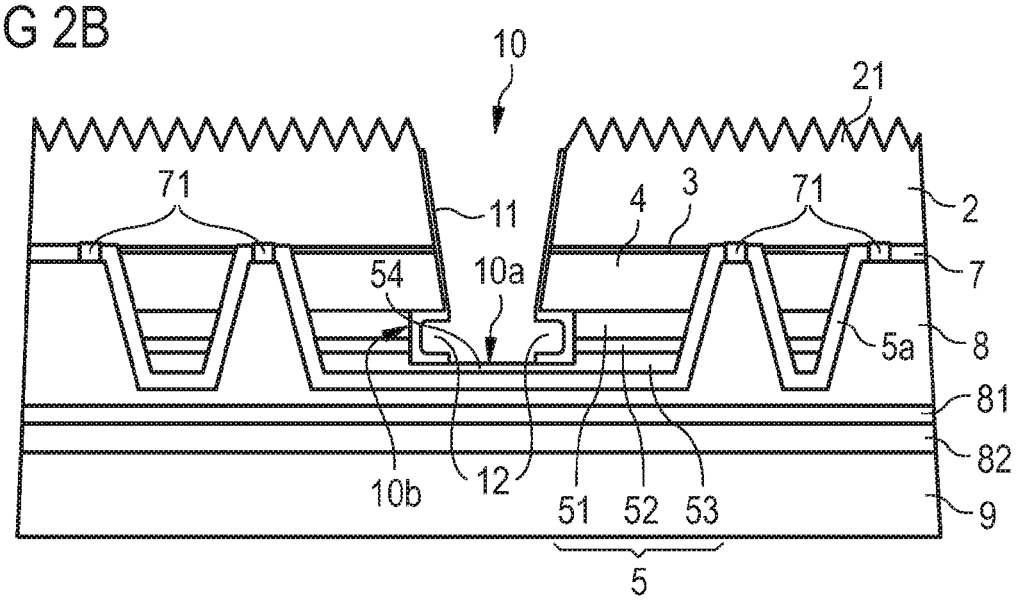

In conjunction with FIGS. 2A and 2B, with reference to schematic sectional illustrations, a further exemplary embodiment of a method described here is explained in greater detail, which can dispense with the phototechnique described in conjunction with FIG. 1N for opening the passivation layer 11 above the reinforcing layer 53 of the metal layer sequence 5. As is evident from FIG. 2A, in this case, plasma-assisted etching is carried out over the whole area without prior definition of a mask after method step 1M. As a result, the passivation layer 11 is removed at the top side of the n-conducting layer 2 remote from the carrier 9, that is to say the radiation passage area 21. Since the passivation layer 11 is thicker in the region of the overhang of the p-conducting layer in the opening 10 over the mirror layer 51 than in other regions of the semiconductor body, the passivation layer 11 remains present there, thereby ensuring a sufficient encapsulation of the mirror layer 51 at the side areas 10b of the opening 10. In this case, FIG. 2B shows the singulated optoelectronic semiconductor chip in a schematic sectional illustration.

In conjunction with the schematic sectional illustration in FIG. 4, a further exemplary embodiment of an optoelectronic semiconductor chip described here is explained in greater detail. In contrast to the optoelectronic semiconductor chip described in conjunction with FIG. 1O, the way in which contact is made with the optoelectronic semiconductor chip on the n-side in this case is not via the carrier 9. The carrier 9 can therefore also be formed with an electrically insulating material. Alternatively or additionally, an insulation layer 83 consisting of silicon dioxide, for example, can be arranged between the carrier 9 and the metal layer 8.

In the exemplary embodiment in FIG. 4, electrical contact is made with the optoelectronic semiconductor chip through two openings 10. By means of the opening 101, contact is made with the optoelectronic semiconductor chip on the p-side. The reinforcing layer 53 of the metal layer sequence 5 once again serves as a connection pad 54.

Contact is made with the optoelectronic semiconductor chip on the n-side via the opening 102. For this purpose, in the region of the opening 102 between the metal layer sequence 5, that is to say the reinforcing layer 53, and the metal layer 8, an additional opening 711 is formed, in which the insulation layer 7 is perforated. This opening can be produced for example in the method step described in conjunction with FIG. 1E in the passivation layer 7, that is to say during the definition of the second mask required in the method. Electrically conductive contact can be made with the optoelectronic semiconductor chip described in conjunction with FIG. 4 through the two openings 101, 102 in each case by means of a connection wire.

In the exemplary embodiment described in conjunction with FIG. 5 of an optoelectronic semiconductor chip described here, contact is made with the optoelectronic semiconductor chip on the n-side through the carrier 9, as also in the exemplary embodiment in FIG. 1O. In this exemplary embodiment, however, the optoelectronic semiconductor chip additionally comprises an ESD partial region 13, which is formed in a partial region of n-conducting layer 2, active zone 3 and p-conducting semiconductor layer 4 and also metal layer sequence 5, said partial region being circumferentially separated by the opening 102. By means of the metallization 131, which is electrically conductively connected to the reinforcing layer 53 of the metal layer sequence 5 uncovered at the bottom area of the opening 102, and by means of the opening 711 in the insulation layer 7, the ESD partial region is interconnected in antiparallel with the remaining regions of the optoelectronic semiconductor chip. In this way, the ESD partial region 13 forms an ESD protective diode for the optoelectronic semiconductor chip, said diode being circumferentially surrounded by the radiation-emitting active zone 3. In this case, the n-type contact 71, like the opening 102, is also configured circumferentially in order to avoid a short circuit. The optoelectronic semiconductor chip in accordance with the exemplary embodiment in FIG. 5 requires at least one further phototechnique required for patterning the metallization 131.

Figure 6:
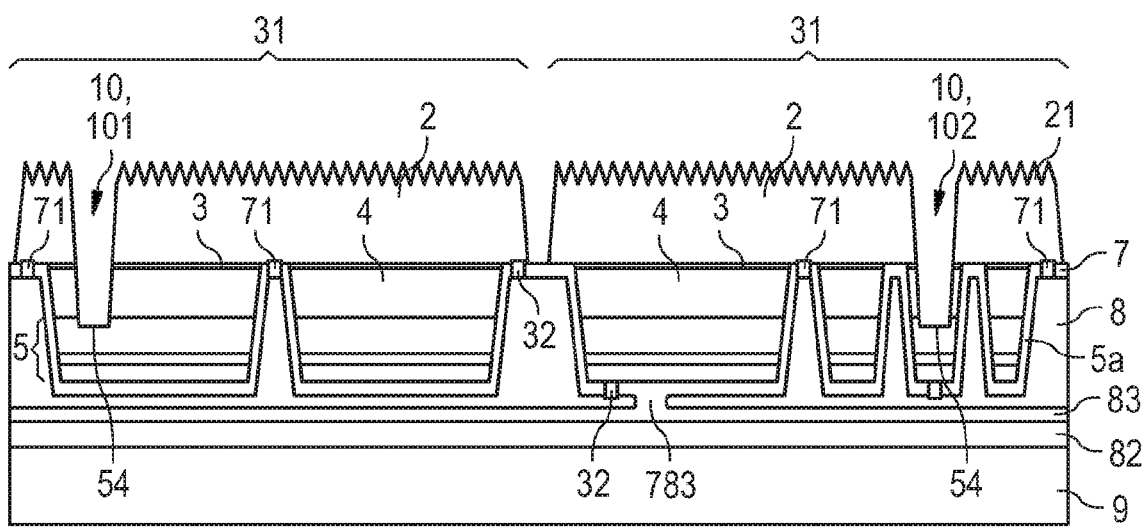
FIG. 6 illustrates a further schematic sectional view of an optoelectronic semiconductor chip according to an exemplary embodiment.

A further exemplary embodiment of an optoelectronic semiconductor chip described here is explained in greater detail in conjunction with FIG. 6. In this exemplary embodiment, the optoelectronic semiconductor chip is subdivided into a plurality of active partial regions 31. That is to say that the layers jointly grown epitaxially are subdivided into a plurality of partial regions separated in a lateral direction. FIG. 6 illustrates two active partial regions 31, which form two pixels of the optoelectronic semiconductor chip. In this case, the active partial regions 31 are connected in series with one another by the electrical connections 32, wherein the metal layer 8 for making contact with the optoelectronic semiconductor chip on the n-side is respectively interrupted by the insulation 783 between adjacent partial regions 31. The optoelectronic semiconductor chip is an optoelectronic semiconductor chip as described in conjunction with FIG. 4, in which chip the way in which contact is made with the chip on the n-side is not through the carrier 9, but rather through connection pads 54 in the openings 101, 102. The production of the openings in the insulation layer 7 which are necessary for the electrical connections 32 and also the production of an opening for forming the insulation 783 in the metal layer 8 are effected, for example, together with the opening of the insulation layer 7 described in conjunction with FIG. 1E, that is to say during the second phototechnique. During the operation of the optoelectronic semiconductor chip, in each case a voltage of for example at least 2 V is dropped across the partial regions 31. In this way, by connecting a plurality of active partial regions 31 in series, it is possible to produce an optoelectronic semiconductor chip which can be operated with voltages of 90 V or more.

Overall, methods for producing optoelectronic semiconductor chips are described here with which optoelectronic semiconductor chips can be produced in a particularly cost-effective manner on account of the small number of phototechniques. Alongside their simple producibility, the optoelectronic semiconductor chips are distinguished, for example, by a circumferential metallic encapsulation of the mirror layer 52 and hence a high mechanical and chemical stability.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102010024079.6, the disclosure content of which is hereby incorporated by reference.

The invention claimed is:

1. An optoelectronic semiconductor chip comprising:
a metal layer sequence and a p-conducting layer,
wherein
the metal layer sequence comprises one mirror layer and a barrier layer,
the mirror layer of the metal layer sequence faces the p-conducting layer,
the p-conducting layer laterally projects beyond the mirror layer, and
a lateral overhang of the p-conducting layer beyond the mirror layer is at most 5 µm.

2. The optoelectronic semiconductor chip according to claim 1, further comprising an n-conducting layer, wherein an opening is formed which extends through the n-conducting layer and the p-conducting layer, a layer of the metal layer sequence is uncovered at a bottom area of the opening, and a connection pad for making electrical contact with the semiconductor chip is formed at the bottom area.

3. The optoelectronic semiconductor chip according to claim 2, wherein the opening at least partly extends through the mirror layer of the metal layer sequence, and a side area of the opening is completely covered by a passivation layer at least in the region of the mirror layer.

4. The optoelectronic semiconductor chip according to claim 3, wherein the passivation layer is produced by means of an ALD process.

5. The optoelectronic semiconductor chip according to claim 2, wherein the p-conducting layer laterally projects beyond the mirror layer in the opening.

6. The optoelectronic semiconductor chip according to the claim 5, wherein a side area of the opening in the region of the mirror layer forms, with that surface of a carrier of the semiconductor chip which faces the mirror layer, a different angle from a side area of the opening in the region of the p-conducting layer.

7. The optoelectronic semiconductor chip according to claim 1, wherein at least two openings are formed, a connection pad for making contact with the semiconductor chip on an n-side of the optoelectronic semiconductor chip is formed in one of the openings, and a connection pad for making contact with the semiconductor chip on a p-side of the optoelectronic semiconductor chip is formed in another of the openings.

8. The optoelectronic semiconductor chip according to claim 1, wherein side areas of the metal layer sequence apart from the openings at least indirectly adjoin a metal layer that is electrically conductively connected to an n-conducting semiconductor material of the optoelectronic semiconductor chip.

9. The optoelectronic semiconductor chip according to claim 1, wherein at least one opening is laterally completely surrounded by an active zone.

10. The optoelectronic semiconductor chip according to claim 1, further comprising an n-conducting layer, wherein an ESD partial region of the semiconductor chip, which comprises parts of the metal layer sequence, of the p-conducting layer and of the n-conducting layer, is electrically connected in antiparallel with the rest of the semiconductor chip, and the ESD partial region forms an ESD protective diode for the rest of the semiconductor chip.

11. The optoelectronic semiconductor chip according to the claim 10, wherein the ESD partial region is laterally completely surrounded by an active zone of the optoelectronic semiconductor chip.

12. The optoelectronic semiconductor chip according to claim 1, wherein the semiconductor chip is subdivided into at least two active partial regions which are electrically connected in series.

13. The optoelectronic semiconductor chip according to the claim 12, wherein an electrical connection between the active partial regions is arranged below the radiation exit area of the semiconductor chip.

14. The optoelectronic semiconductor chip according to claim 12, wherein a voltage of at least 2 V is dropped across each active partial region during an operation of the semiconductor chip.

15. An optoelectronic semiconductor chip comprising:
a metal layer sequence, an n-conducting layer, a p-conducting layer, an active zone and an insulation layer,
wherein
the metal layer sequence comprises one mirror layer and a barrier layer,
the mirror layer of the metal layer sequence faces the p-conducting layer,
the p-conducting layer laterally projects beyond the mirror layer,
a lateral overhang of the p-conducting layer beyond the mirror layer is at most 5 µm,
the insulation layer covers regions of the n-conducting layer and outer areas of the p-conducting layer, of the active zone and of the metal layer in sequence,
the insulation layer has a plurality of openings which are formed throughout the insulation layer towards the n-conducting layer, and
a metal layer is arranged on the insulation layer and extends throughout the openings, so that the metal layer is electrically conductively connected to the n-conducting layer.

* * * * *